(12) United States Patent  
Sakaguchi et al.

(10) Patent No.: US 9,741,652 B1
(45) Date of Patent: Aug. 22, 2017

(54) WIRING SUBSTRATE

(71) Applicant: SHINKO ELECTRIC INDUSTRIES CO., LTD., Nagano (JP)

(72) Inventors: Yuta Sakaguchi, Nagano (JP); Yusuke Gozu, Nagano (JP); Noriyoshi Shimizu, Nagano (JP)

(73) Assignee: SHINKO ELECTRIC INDUSTRIES CO. LTD., Nagano (JP)

( * ) Notice: Subject to any disclaimer, the term of this patent is extended or adjusted under 35 U.S.C. 154(b) by 0 days.

(21) Appl. No.: 15/488,659

(22) Filed: Apr. 17, 2017

(30) Foreign Application Priority Data

Jun. 13, 2016 (JP) ................................ 2016-116956

(51) Int. Cl.
H05K 1/02 (2006.01)
H05K 1/11 (2006.01)
H01L 23/498 (2006.01)
H01L 21/48 (2006.01)
H05K 1/18 (2006.01)

(52) U.S. Cl.
CPC ...... H01L 23/49838 (2013.01); H01L 21/481 (2013.01); H01L 21/4853 (2013.01); H01L 23/49866 (2013.01); H05K 1/0284 (2013.01); H05K 1/0296 (2013.01); H05K 1/111 (2013.01);
(Continued)

(58) Field of Classification Search
CPC ......... H01L 23/49838; H01L 23/49866; H01L 21/481; H01L 21/4853; H05K 1/0213; H05K 1/0216; H05K 1/0218; H05K 1/0219; H05K 1/0224; H05K 1/0227; H05K 1/0228; H05K 1/0236; H05K 1/0237; H05K 1/0239; H05K 1/024; H05K 1/0242; H05K 1/0245; H05K 1/0246; H05K 1/0248; H05K 1/0254; H05K 1/0256; H05K 1/0257; H05K 1/0259; H05K 1/026; H05K 1/0263; H05K 1/0265; H05K 1/0278; H05K 1/0284; H05K 1/0296; H05K 1/0298; H05K 1/036; H05K 1/0366; H05K 1/0373; H05K 1/0393

See application file for complete search history.

(56) References Cited

U.S. PATENT DOCUMENTS 3,881,884 A * 5/1975 Cook ....................... H01B 1/00
216/13
5,081,520 A * 1/1992 Yoshii ................... H01L 21/563
257/702

(Continued)

FOREIGN PATENT DOCUMENTS

JP 2004-259774 9/2004

Primary Examiner — Ishwarbhai B Patel
(74) Attorney, Agent, or Firm — IPUSA, PLLC

(57) ABSTRACT

A wiring substrate includes a wiring layer on a projection of an insulating layer. The wiring layer includes a first metal layer on an end face of the projection with a peripheral portion of the end face exposed, a second metal layer that is on the first metal layer and wider than the end face, and a third metal layer. The second metal layer includes first and second opposite surfaces with the second surface on the first metal layer with a peripheral portion thereof exposed. The third metal layer covers side surfaces of the first metal layer, and the first surface, the peripheral portion of the second surface, and side surfaces of the second metal layer, and fills in a region where the end face and the peripheral portion of the second surface face each other. The materials of the second and third metal layers are different.

4 Claims, 5 Drawing Sheets

(52) U.S. Cl.
CPC ........... *H05K 1/0216* (2013.01); *H05K 1/181* (2013.01); *H05K 2201/09218* (2013.01)

(56) References Cited

U.S. PATENT DOCUMENTS

| | | | |
|---|---|---|---|
| 6,518,088 B1* | 2/2003 | Heerman | H01L 23/13 |
| | | | 257/701 |
| 6,759,599 B2* | 7/2004 | Tatoh | H01L 21/4846 |
| | | | 174/255 |
| 8,338,718 B2* | 12/2012 | Kaneko | H01L 21/4853 |
| | | | 174/263 |
| 9,560,772 B2* | 1/2017 | Kopf | H05K 1/119 |

* cited by examiner

WIRING SUBSTRATE

CROSS-REFERENCE TO RELATED APPLICATION

This application is based upon and claims the benefit of priority of the prior Japanese Patent Application No. 2016-116956, filed on Jun. 13, 2016, the entire contents of which are incorporated herein by reference.

FIELD

A certain aspect of the embodiment discussed herein is related to wiring substrates.

BACKGROUND

There is a demand for an increase in the wiring density of a wiring layer in wiring substrates on which semiconductor chips are mountable. For example, a semi-additive process is used to form a high-density wiring layer. When wiring layers become higher in wiring density to reduce the interval between wiring patterns, there arises concern about a decrease in insulation reliability due to, for example, the occurrence of ion migration. Various measures have been taken to address such concern.

For example, to remove metal residues between wiring patterns considered as the cause of the occurrence of ion migration, the technique of removing a substrate surface between wiring patterns by etching is proposed. According to this technique, a depression is formed between wiring patterns by etching. (See, for example, Japanese Laid-open Patent Publication No. 2004-259774.)

SUMMARY

According to an aspect of the embodiment, a wiring substrate includes a wiring layer on a projection of an insulating layer. The wiring layer includes a first metal layer on an end face of the projection with a peripheral portion of the end face exposed, a second metal layer that is on the first metal layer and wider than the end face, and a third metal layer. The second metal layer includes first and second opposite surfaces with the second surface on the first metal layer with a peripheral portion thereof exposed. The third metal layer covers side surfaces of the first metal layer, and the first surface, the peripheral portion of the second surface, and side surfaces of the second metal layer, and fills in a region where the end face and the peripheral portion of the second surface face each other. The materials of the second and third metal layers are different.

The object and advantages of the embodiment will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
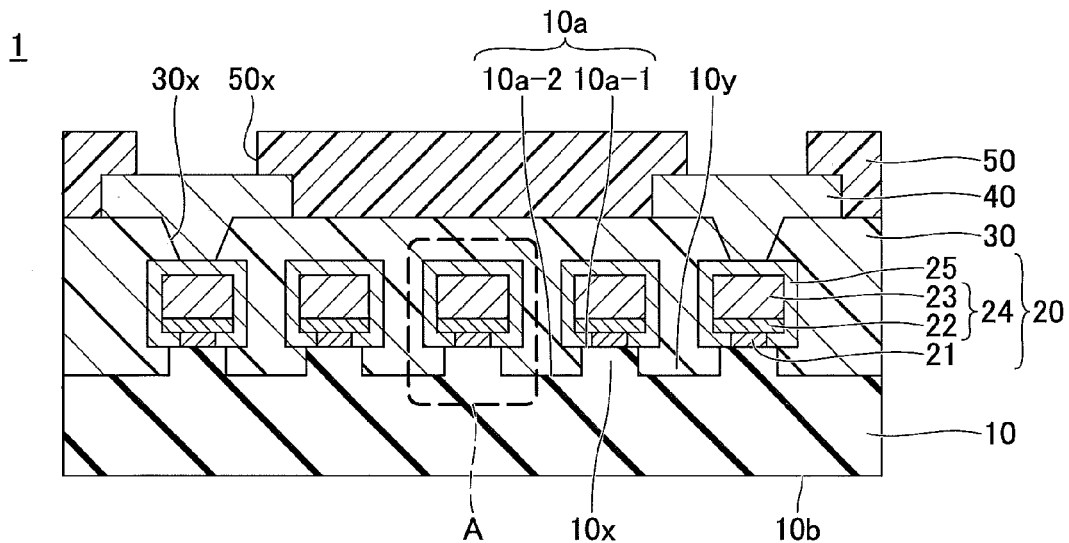
FIGS. 1A and 1B are cross-sectional views of a wiring substrate according to an embodiment.

As described above, various measures have been taken to address concern about a decrease in insulation reliability. In order to accommodate a further increase in the wiring density of a wiring layer, however, more effective measures for the prevention of a decrease in insulation reliability are desired.

According to an aspect of the present invention, a wiring substrate in which the wiring density of a wiring layer is increased without a decrease in insulation reliability is provided.

One or more preferred embodiments of the present invention will be explained with reference to accompanying drawings. In the following description, the same elements are referred to using the same reference numeral, and a repetitive description thereof may be omitted.

[Structure of Wiring Substrate]

Figure 1B:
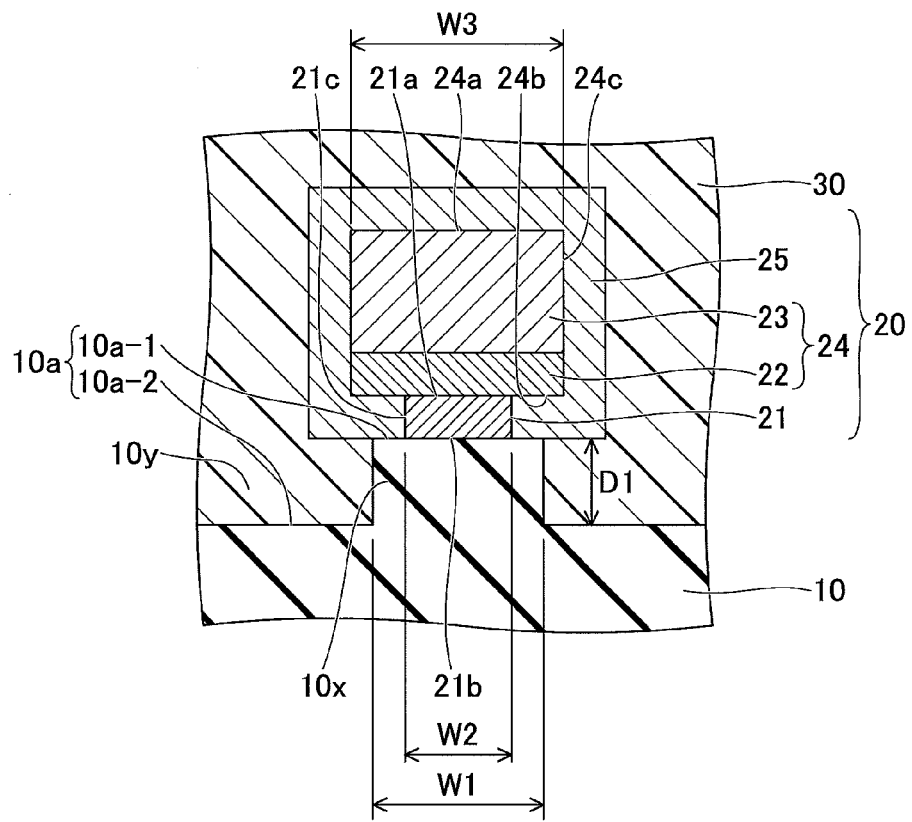

FIG. 1A is a cross-sectional view of part of a wiring substrate in which wiring layers and insulating layers are alternately stacked according to an embodiment. FIG. 1B is an enlarged view of part A indicated by the dashed line in FIG. 1A.

Referring to FIG. 1A, a wiring substrate 1 includes an insulating layer 10, a wiring layer 20, an insulating layer 30, a wiring layer 40, and a protective insulating layer 50.

According to this embodiment, for convenience of description, the protective insulating layer 50 side of the wiring substrate 1 will be referred to as "upper side" or "first side," and the insulating layer 10 side of the wiring substrate 1 will be referred to as "lower side" or "second side." Furthermore, with respect to each part or element of the wiring substrate 1, a surface on the protective insulating layer 50 side will be referred to as "upper surface" or "first surface," and a surface on the insulating layer 10 side will be referred to as "lower surface" or "second surface." The wiring substrate 1, however, may be used in an inverted position or oriented at any angle. Furthermore, a plan view refers to a view of an object taken in a direction normal to an upper surface 10a of the insulating layer 10, and a planar shape refers to the shape of an object viewed in a direction normal to the upper surface 10a of the insulating layer 10.

The insulating layer 10 is, for example, an insulating layer to serve as an interlayer insulating layer in multilayer wiring to allow formation of multilayer wiring using a build-up process. As the insulating layer 10, for example, an insulating resin having glass cloth impregnated with a thermosetting insulating resin such as an epoxy resin may be used. An insulating resin having a woven or non-woven fabric of glass fibers, carbon fibers, or aramid fibers impregnated with a thermosetting insulating resin such as an epoxy resin may also be used as the insulating layer 10. When formed of a thermosetting insulating resin, the insulating layer 10 may have a thickness of, for example, approximately 10 μm to approximately 1000 μm.

Alternatively, for example, a photosensitive insulating resin such as a phenolic resin or a polyimide resin may be used as the material of the insulating layer 10. When formed of a photosensitive insulating resin, the insulating layer 10 may have a thickness of, for example, approximately 5 μm to approximately 10 μm. The insulating layer 10 may contain a filler such as silica or alumina on an as-needed basis while containing a photosensitive insulating resin as a principal component.

The insulating layer 10 includes the upper surface 10a and a lower surface 10b. Although not depicted, the lower surface 10b covers an insulating layer and a wiring layer under the insulating layer 10, and the insulating layer 10 includes via interconnects for electrically connecting the wiring layer 20 and the wiring layer under the insulating layer 10.

The insulating layer 10 includes projections 10x and depressions 10y formed in the upper surface 10a. Specifically, of the upper surface 10a of the insulating layer 10, a region on which the wiring layer 20 is formed is on the projections 10x and the other region is in the depressions 10y. That is, the upper surface 10a positioned (exposed) outside the wiring layer 20 (between adjacent patterns of the wiring layer 20) is dug in (depressed) toward the lower surface 10b to form the depressions 10y.

In the upper surface 10a, a surface of each projection 10x on its first side is referred to as "upper end face 10a-1" (end face) and a surface of each depression 10y on its second side is referred to as "bottom surface 10a-2". Furthermore, the sidewall surfaces of the projections 10x also serve as the inner wall surfaces of the depressions 10y. That is, the projections 10x and the depressions 10y are continuously provided. The bottom surfaces 10a-2 of the depressions 10y are positioned lower (closer to the lower surface 10b) than the upper end faces 10a-1 of the projections 10x. A width W1 of the upper end face 10a-1 of each projection 10x (the width of the insulating layer 10 between the depressions 10y) may be, for example, approximately 2 μm to approximately 5 μm. A depth D1 of the depressions 10y may be, for example, approximately 0.5 μm to approximately 2 μm. Hereinafter, the projections 10x are collectively referred to as "projection 10x" where a description is common to the projections 10x, and the depressions 10y are collectively referred to as "depression 10y" where a description is common to the depressions 10y.

The wiring layer 20 is formed on the upper end face 10a-1 of the projection 10x of the insulating layer 10. The wiring layer 20 includes a metal film (metal layer) 21, a metal layer 24, and a metal layer 25. The wiring layer 20 is a fine-line wiring layer (a wiring layer including high-density wiring patterns). Here, the fine-line wiring layer refers to a wiring layer whose line/space is 10 μm/10 μm or less. The line/space of the wiring layer 20 may be, for example, approximately 2 μm/2 μm to approximately 5 μm/5 μm. The thickness of the wiring layer 20 (the total thickness between the lower surface of the metal film 21 and the upper surface of the metal layer 25) may be, for example, approximately 1 μm to approximately 3 μm.

The "line" in "line/space" represents the width of a wiring pattern, and the "space" in "line/space" represents the interval between adjacent wiring patterns (wiring interval). For example, when the line/space is described as 10 μm/10 μm, this line/space indicates that the width of a wiring pattern is 10 μm and the wiring interval is 10 μm.

The metal film 21 includes an upper surface 21a, a lower surface 21b, and side surfaces 21c. The metal film 21 is formed on the upper end face 10a-1 of the projection 10x except for a peripheral portion of the upper end face 10a-1 (namely, the metal film 21 is formed on the region of the upper end face 10a-1 within its peripheral portion). Specifically, the upper surface 21a contacts a lower surface 24b of the metal layer 24 except for a peripheral portion of the lower surface 24b (namely, the upper surface 21a contacts the region of the lower surface 24b within its peripheral portion). The lower surface 21b contacts the upper end face 10a-1 of the projection 10x except for its peripheral portion (namely, the lower surface 21b contacts the region of the upper end face 10a-1 within its peripheral portion). The side surfaces 21c contact the metal layer 25.

The metal film 21 is formed of a metal more adhesive to the insulating layer 10 than is the metal layer 24. The metal film 21 is a so-called adhesion layer. When the material of the metal layer 24 is copper (Cu), for example, titanium, nickel, or chromium may be used as the material of the metal film 21. The thickness of the metal film 21 may be, for example, approximately 20 nm to approximately 100 nm.

Furthermore, a width W2 of the metal film 21 is smaller than the width W1 of the upper end face 10a-1 of the projection 10x. Specifically, the width W2 of the metal film 21 is smaller than the width W1 of the upper end face 10a-1 of the projection 10x by, for example, approximately 0.2 μm to approximately 0.4 μm. In other words, the peripheral portion of the upper end face 10a-1 of the projection 10x is, for example, an exposed region (not covered with the metal film 21) laterally extending approximately 0.1 μm to approximately 0.2 μm around the metal film 21.

The metal layer 24 is formed on the upper surface 21a of the metal film 21. Specifically, the metal layer 24 includes a metal film 22 and a metal film 23. The metal film 22 is formed on the metal film 21 with a peripheral portion of the lower surface of the metal film 22 being exposed (not covered with the metal film 21) outside the upper surface 21a of the metal film 21. The metal film 22 is a so-called seed layer for forming the metal film 23.

The metal film 23 is stacked on the metal film 22. Suitable materials for the metal film 22 and the metal film 23 include, for example, copper. The thickness of the metal film 22 may be, for example, approximately 100 nm to approximately 500 nm. The thickness of the metal film 23 may be, for example, approximately 1 μm to approximately 6 μm.

The metal layer 24 includes an upper surface 24a, the lower surface 24b, and side surfaces 24c. The metal layer 24 is formed on the metal film 21 with a peripheral portion of the lower surface 24b (the peripheral portion of the lower surface of the metal film 22) being exposed (not covered with the metal film 21) outside the upper surface 21a of the metal film 21. Furthermore, a width W3 of the metal layer 24 is greater than the width W1 of the upper end face 10a-1 of the projection 10x. Specifically, the width W3 of the metal layer 24 is greater than the width W1 of the upper end face 10a-1 of the projection 10x by, for example, approximately 0.1 μm to approximately 0.3 μm.

The metal layer 25 covers the side surfaces 21c of the metal film 21 and the upper surface 24a, the side surfaces 24c, and the peripheral portion of the lower surface 24b of the metal layer 24. Furthermore, the metal layer 25 fills in a region (space) where the upper end face 10a-1 of the projection 10x and the peripheral portion of the lower surface 24b of the metal layer 24 face each other.

The metal layer 25 is formed of a metal that is less likely to cause ion migration than the metal layer 24. When the material of the metal layer 24 is copper, for example, nickel phosphorus (Ni—P) may be used as the material of the metal layer 25. Other suitable materials for the metal layer 25 include, for example, nickel tungsten boron (NiWB) and cobalt tungsten phosphorus (CoWP). The thickness of the metal layer 25 may be, for example, approximately 20 nm to approximately 200 nm.

The insulating layer 30 is formed on the insulating layer 10 to cover the wiring layer 20 and fill in the depression 10y.

For example, the material of the insulating layer 30 may be the same as the material of the insulating layer 10. The insulating layer 30 may be famed on the insulating layer 10, using either the same material as or a material different from the material of the insulating layer 10.

Multiple wiring layers 20 and multiple insulating layers 30 may be alternately stacked on the insulating layer 10. In this case, the wiring layer 40 is formed on the uppermost insulating layer 30.

The wiring layer 40 is famed on the upper surface of the insulating layer 30, and is electrically connected to the wiring layer 20 via an adhesion layer and a seed layer (not depicted) on an as-needed basis. The wiring layer 40 includes via interconnects filling in via holes 30x piercing through the insulating layer 30 to expose the upper surface of the wiring layer 20 and wiring patterns formed on the upper surface of the insulating layer 30. Suitable materials for the wiring layer 40 include, for example, copper. The wiring patterns of the wiring layer 40 are metal posts or pads projecting from the upper surface of the insulating layer 30. The wiring layer 40 may include routing wiring patterns that interconnect metal posts or pads on the upper surface of the insulating layer 30 on an as-needed basis. The wiring layer 40 may project from the upper surface of the insulating layer 30 by, for example, approximately 1 μm to approximately 10 μm.

The protective insulating layer 50 is formed on the insulating layer 30 to cover the wiring layer 40. Suitable materials for the protective insulating layer 50 include, for example, photosensitive insulating resins whose principal component is a phenolic resin or a polyimide resin. The protective insulating layer 50 may contain a filler such as silica or alumina on an as-needed basis while containing a photosensitive insulating resin as a principal component. The thickness of the protective insulating layer 50 may be, for example, approximately 5 μm to approximately 30 μm.

The protective insulating layer 50 includes openings 50x. Part of the wiring layer 40 is exposed at the bottom of the openings 50x. The part of the wiring layer 40 exposed at the bottom of the openings 50x serves as, for example, pads to be electrically connected to a semiconductor chip or the like. When the wiring patterns of the wiring layer 40 are metal posts, the protective insulating layer 50 may be formed to cover the side surfaces of the metal posts. The protective insulating layer 50 is optional and may be omitted.

A surface treatment layer (not depicted) may be formed on the upper surface (upper surface alone or upper and side surfaces in the case of metal posts) of the wiring layer 40 exposed at the bottom of the openings 50x. Examples of surface treatment layers include a gold (Au) layer, a Ni/Au layer (a laminated metal layer of a Ni layer and a Au layer that are stacked in this order), and a Ni/Pd/Au layer (a laminated metal layer of a Ni layer, a palladium [Pd] layer, and a Au layer that are stacked in this order). An anti-oxidation treatment such as an organic solderability preservative (OSP) process may be performed on the upper surface of the wiring layer 40 exposed at the bottom of the openings 50x to form a surface treatment layer.

[Method of Manufacturing Wiring Substrate]

Next, a method of manufacturing a wiring substrate according to this embodiment is described. FIGS. 2A through 2K are diagrams depicting a process of manufacturing a wiring substrate according to this embodiment. According to the process illustrated below, a single wiring substrate is manufactured. The process, however, may be adapted to manufacture a structure to become multiple wiring substrates and thereafter divide the structure into individual wiring substrates.

Figure 2A:
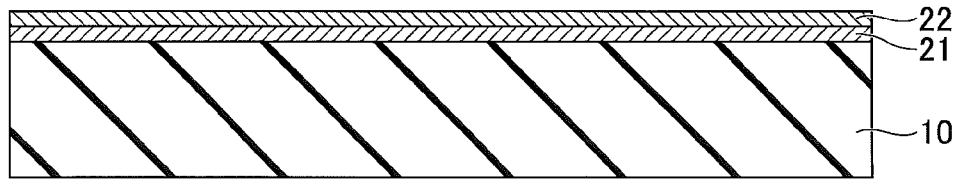
FIGS. 2A through 2K are diagrams depicting a process of manufacturing a wiring substrate according to the embodiment.

First, in the process depicted in FIG. 2A, the insulating layer 10 is prepared, and the metal film 21 and the metal film 22 are successively stacked on the first surface of the insulating layer 10 by, for example, sputtering or electroless plating. The material, thickness, etc., of the insulating layer 10 are as described above.

While suitable materials for the metal film 21 include, for example, titanium, nickel, and chromium, titanium is used as the material of the metal film 21 in the illustrated case. The thickness of the metal film 21 may be, for example, approximately 20 nm to approximately 100 nm. Suitable materials for the metal film 22 include, for example, copper. The thickness of the metal film 22 may be, for example, approximately 100 nm to approximately 500 nm. The metal film 21 is an adhesion layer provided to increase the adhesion between the insulating layer 10 and the metal layer 24. The metal film 22 is a seed layer for forming the metal film 23.

Figure 2B:
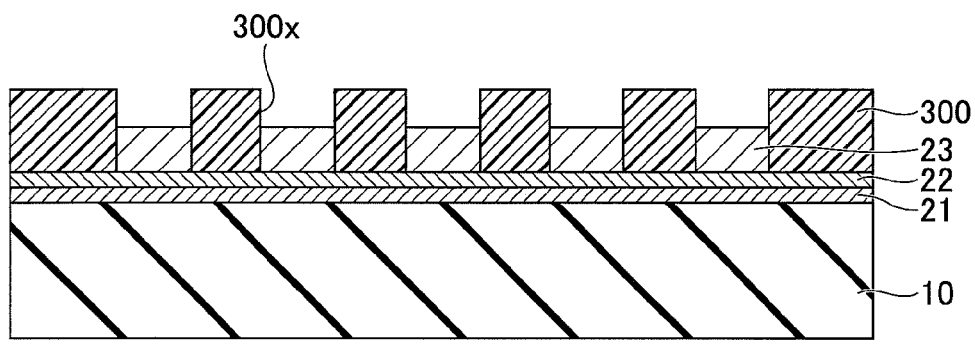

Next, in the process depicted in FIG. 2B, a resist layer 300 (such as a dry film resist) having openings 300x is formed on the upper surface of the metal film 22. The metal film 23 of, for example, copper is formed on the metal film 22 exposed in the openings 300x by electroplating, using the metal film 22 as a power feed layer. The thickness of the metal film 23 may be, for example, approximately 1 μm to approximately 6 μm.

Figure 2C:
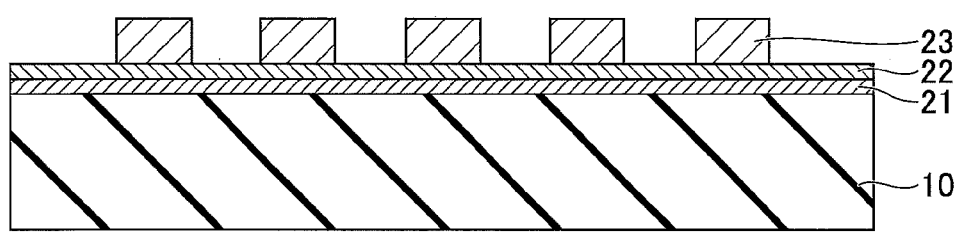
Figure 2D:
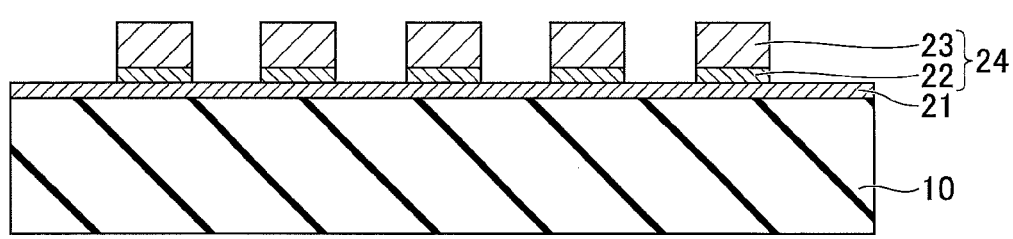

Next, in the process depicted in FIG. 2C, the resist layer 300 is removed using a stripper, and in the process depicted in FIG. 2D, an exposed part of the metal film 22 not covered with the metal film 23 is removed by, for example, wet etching, using the metal film 23 as a mask. When the metal film 22 is formed of copper, the exposed part of the metal film 22 may be removed, using, for example, an acid aqueous solution of oxidizing liquid. As a result of the process depicted in FIG. 2D, the metal layer 24 including the metal film 22 and the metal film 23 is selectively formed on the upper surface of the metal film 21.

Figure 2E:
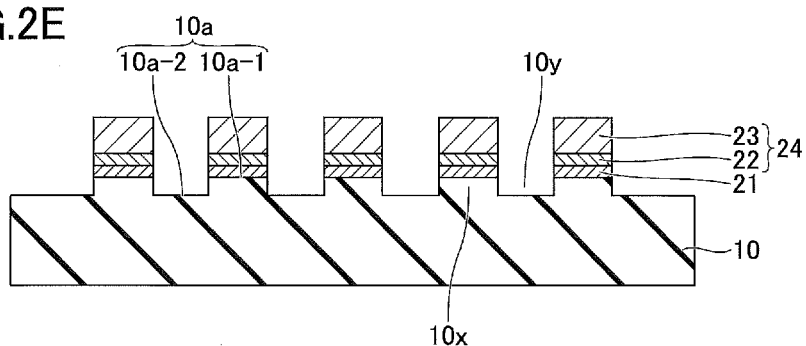

Next, in the process depicted in FIG. 2E, the metal film 21 exposed through the metal layer 24 is removed. Furthermore, the upper surface 10a of the insulating layer 10 exposed by the removal of the metal film 21 is cut (dug) into to form the depression 10y around a laminate of the metal film 21 and the metal layer 24.

In other words, as a result of cutting (digging) into the upper surface 10a of the insulating layer 10 exposed by the removal of the metal film 21, a region of the insulating layer 10 on which a laminate of the metal film 21 and the metal layer 24 is formed projects to form the projection 10x. That is, part of the upper surface 10a of the insulating layer 10 on which the metal film 21 and the metal layer 24 are formed becomes the projection 10x, and the rest of the upper surface 10a of the insulating layer 10 becomes the depression 10y. The upper surface 10a of the insulating layer 10 includes the upper end face 10a-1 of the projection 10x and the bottom surface 10a-2 of the depression 10y.

The metal film 21 of titanium and the insulating layer 10 may be removed by, for example, a series of processes of anisotropic etching. Examples of anisotropic etching include reactive ion etching (RIE) using gas such as $CF_4$ or $SF_6$.

Figure 2F:
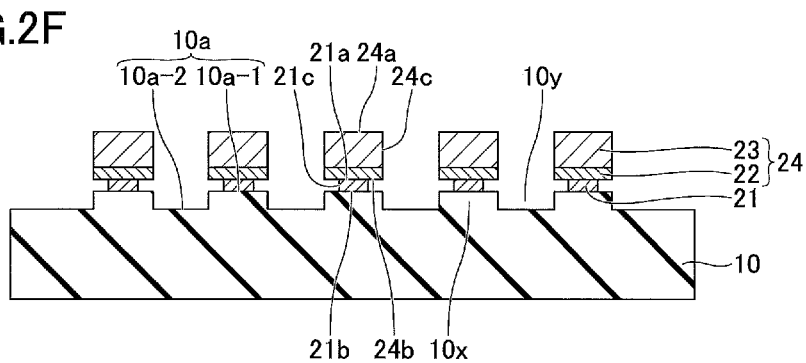

Next, in the process depicted in FIG. 2F, a peripheral portion of the metal film 21 is removed to make the width of the metal film 21 smaller than the width of the metal layer 24. As a result, a peripheral portion of the lower surface 24b of the metal layer 24 is exposed outside the upper surface 21a of the metal film 21. Furthermore, a peripheral portion of the upper end face 10a-1 of the projection 10x of the insulating layer 10 is exposed around the metal film 21. The side surfaces 21c of the metal film 21 are depressed toward the center relative to the side surfaces 24c of the metal layer 24 (the side surfaces of the metal film 22 and the metal film 23) and the inner wall surfaces of the depression 10y of the insulating layer 10. When the metal layer 24 is formed of copper, the metal film 21 of titanium may be selectively removed with respect to the metal layer 24 by, for example, wet etching, using an alkali aqueous solution of oxidizing liquid.

Figure 2G:
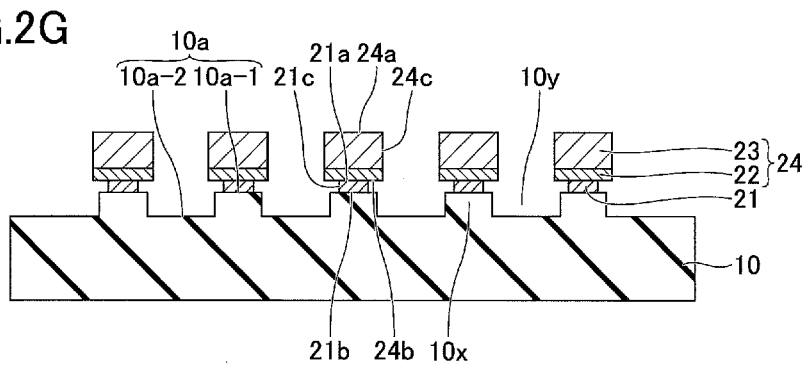

Next, in the process depicted in FIG. 2G, the insulating layer 10 is further removed on the bottom surface side and the inner wall surface side of the depression 10y to make the depression 10y deeper and cause the projection 10x to have a width greater than the width W2 of the metal film 21 and smaller than the width W3 of the metal layer 24 (see FIG. 1B). The depression 10y may be formed by, for example, isotropic etching. Examples of isotropic etching include plasma processing using gas such as $O_2$ or $N_2$. The bottom surface 10a-2 and the inner wall surfaces of the depression 10y are roughened by isotropic etching such as plasma processing. As a result, it is possible to increase the adhesion between the insulating layer 10 and the insulating layer 30 to be formed in a subsequent process.

Figure 2H:
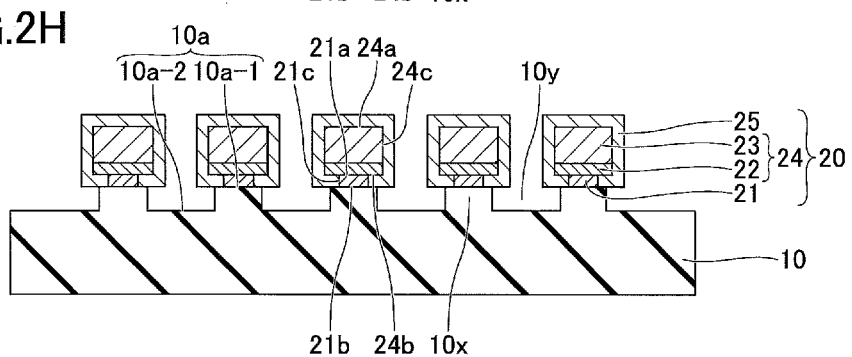

Next, in the process depicted in FIG. 2H, the metal layer 25 is formed to cover the side surfaces 21c of the metal film 21 and the upper surface 24a, the side surfaces 24c, and the exposed peripheral portion of the lower surface 24b of the metal layer 24 (a laminate of the metal film 22 and the metal film 23) and to fill in a region (space) across which the upper end face 10a-1 of the projection 10x and the peripheral portion of the lower surface 24b of the metal layer 24 face each other. For example, the metal layer 25 may be formed of Ni—P by electroless plating. Here, the width W1 of the upper end face 10a-1 of the projection 10x of the insulating layer 10 is smaller than the width W3 of the metal layer 24 (see FIG. 1B). Therefore, in electroless plating, it is easier for liquid metal that becomes the metal layer 25 to flow into the region across which the upper end face 10a-1 of the projection 10x and the peripheral portion of the lower surface 24b of the metal layer 24 (the peripheral portion of the lower surface of the metal film 22) face each other. Accordingly, this region can be easily filled.

Figure 2I:
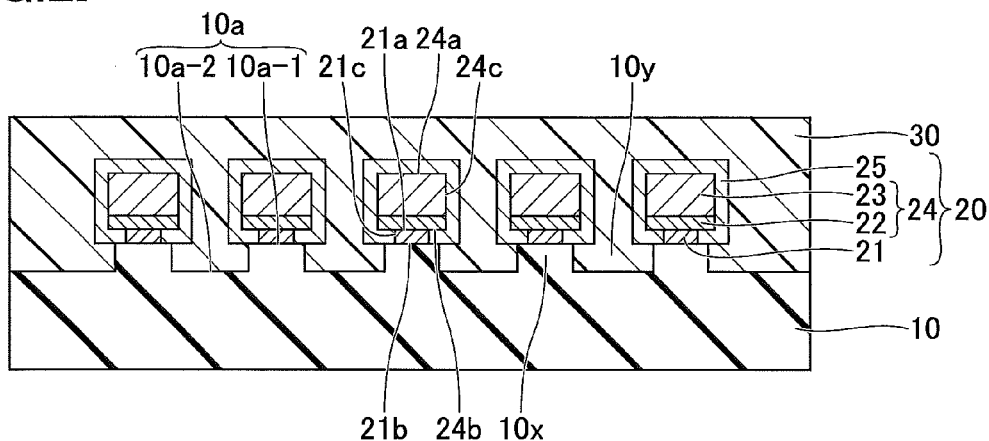

Next, in the process depicted in FIG. 2I, the insulating layer 30 is formed on the insulating layer 10 to cover the wiring layer 20 and fill in the depression 10y. The material and thickness of the insulating layer 30 are as described above. For example, a liquid or paste resin is used as the material of the insulating layer 30, and the liquid or paste resin is applied onto the insulating layer 10 by, for example, spin coating to cover the wiring layer 20 and fill in the depression 10y, and is hardened.

Figure 2J:
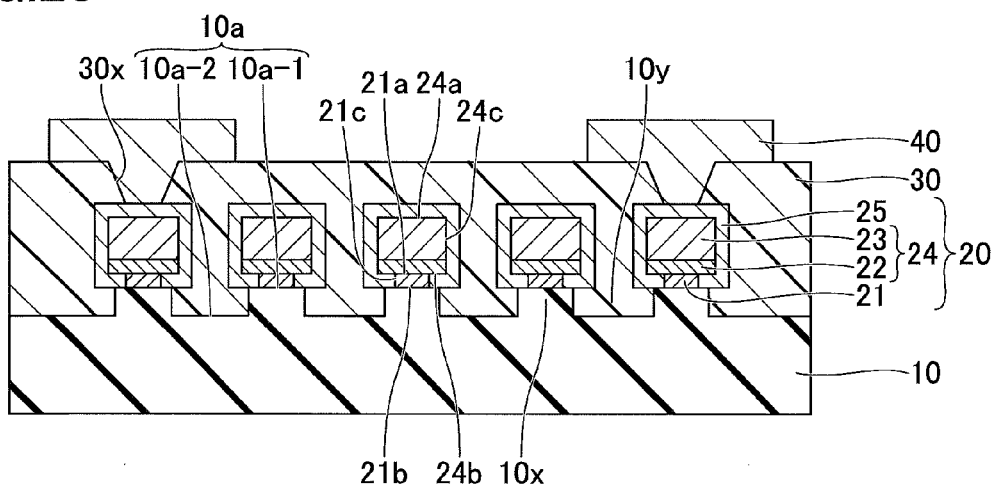

Next, in the process depicted in FIG. 2J, the insulating layer 30 is exposed to light and developed, or is subjected to laser processing, to form the via holes 30x piercing through the insulating layer 30 to expose the upper surface of the wiring layer 20. Then, the wiring layer 40 is famed on the insulating layer 30. The wiring layer 40 may be formed, using, for example, a semi-additive process. Specifically, first, an adhesion layer and a seed layer are formed by sputtering or electroless plating to continuously cover the upper surface of the insulating layer 30, the inner wall surfaces of the via holes 30x, and the upper surface of the wiring layer 20 exposed at the bottom of the via holes 30x. The same material as the metal film 21 may be used for the adhesion layer, and the same material as the metal film 22 may be used for the seed layer. For example, the adhesion layer has the same thickness as the metal film 21, and the seed layer has the same thickness as the metal film 22.

Next, a photosensitive resist is applied onto the adhesion layer and the seed layer and is exposed to light and developed to form a resist layer having openings corresponding to the wiring layer 40. Next, an electroplating layer of, for example, copper is formed in the openings of the resist layer by electroplating, using the adhesion layer and the seed layer as power feed layers. Next, the resist layer is removed, and thereafter, part of the adhesion layer and the seed layer not covered with the electroplating layer is removed by etching, using the electroplating layer as a mask. As a result, the wiring layer 40 having the electroplating layer stacked on the adhesion layer and the seed layer is formed.

Figure 2K:
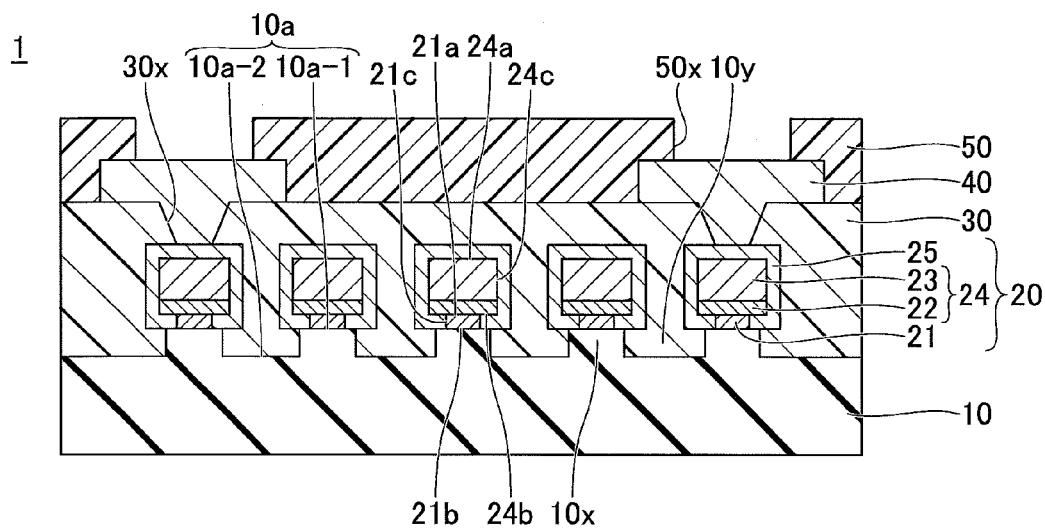

Next, in the process depicted in FIG. 2K, the protective insulating layer 50 is formed on the insulating layer 30 to cover the wiring layer 40. The protective insulating layer 50 may be formed of a photosensitive insulating resin the same as the insulating layer 30. Next, the protective insulating layer 50 is exposed to light and developed to form the openings 50x. Part of the wiring layer 40 is exposed at the bottom of the openings 50x. The above-described surface treatment layer may be formed on the upper surface of the wiring layer 40 exposed at the bottom of the openings 50x by electroless plating or an OSP process. Thereby, the wiring substrate 1 depicted in FIGS. 1A and 1B is completed.

Figure 3A:
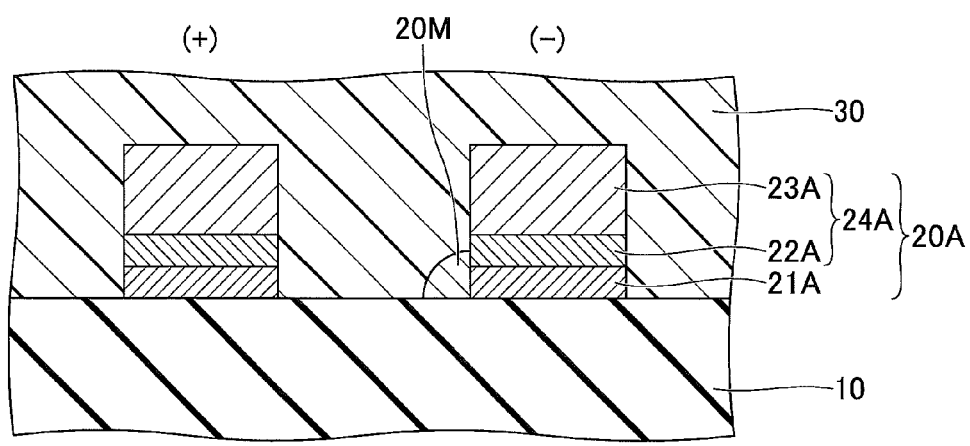
FIGS. 3A and 3B are diagrams for explaining an effect produced by the wiring substrate according to the embodiment.
Figure 3B:
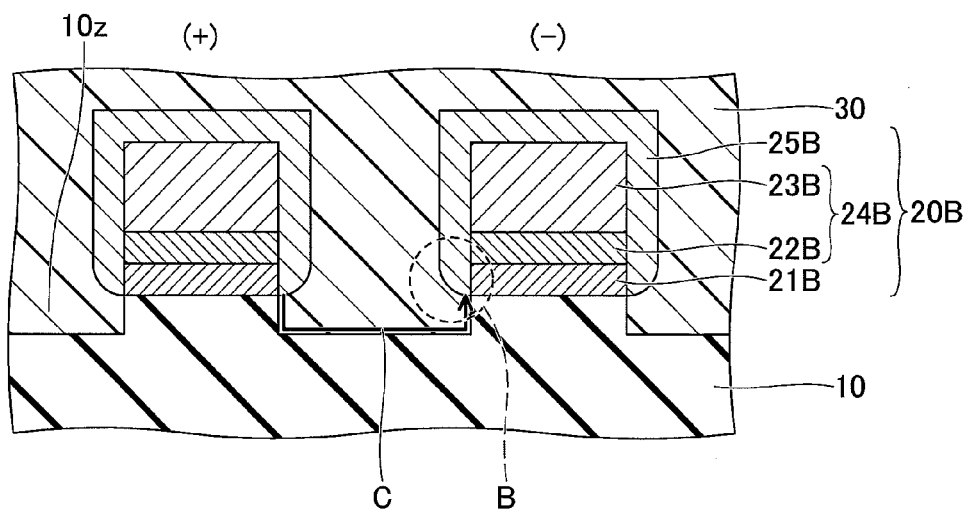

Here, an effect produced by the wiring substrate 1 is described with reference to comparative examples. FIGS. 3A and 3B are diagrams depicting wiring substrates according to comparative examples.

Referring to FIG. 3A, according to a wiring substrate 1X of Comparative Example 1, a wiring layer 20A is formed on the insulating layer 10. According to the wiring layer 20A, a metal film 21A and a metal layer 24A (metal films 22A and 23A) of substantially the same width are successively stacked. The wiring substrate 1X does not include a layer corresponding to the metal layer 25 of the wiring substrate 1. Here, it is assumed that the metal layer 24A is formed of copper.

An insulation test is conducted on the wiring substrate 1X by applying voltage to adjacent wiring patterns of the wiring layer 20A, using one and the other of the adjacent wiring patterns as an anode (+) and a cathode (−), respectively. As a result, ions of copper forming the metal layer 24A migrate from the anode (+) to deposit on the adjacent cathode (−) as dendrites or metal copper 20M. As a result, the insulation reliability of the wiring substrate 1X decreases.

Referring to FIG. 3B, according to a wiring substrate 1Y of Comparative Example 2, a wiring layer 20B is formed on the insulating layer 10. According to the wiring layer 20B, a metal layer 25B covers the upper surface and side surfaces of a laminate of a metal film 21B and a metal layer 24B (metal films 22B and 23B) of substantially the same width that are successively stacked. Furthermore, a depression 10z is formed in the insulating layer 10 between adjacent patterns of the wiring layer 20B. Here, it is assumed that the metal layer 24B is formed of copper. Furthermore, it is assumed that the metal layer 25B is formed of a metal that is less likely to cause ion migration than the metal layer 24B.

Consideration is given to the case where an insulation test is conducted on the wiring substrate 1Y by applying voltage to adjacent wiring patterns of the wiring layer 20B, using one and the other of the adjacent wiring patterns as an anode (+) and a cathode (−), respectively, the same as in the case of the wiring substrate 1X.

While the metal layer 24B is covered with the metal layer 25B to prevent ion migration, the coverage by the metal layer 25B is poor in a lower portion B of the wiring layer 20B encircled by the dashed line in FIG. 3B. Therefore, when the insulation test is conducted, ions of copper forming the metal layer 24B migrate from the anode (+) to the cathode (−) along the interface between the insulating layer 10 and the insulating layer 30 as indicated by the arrow C in FIG. 3B. As a result, the insulation reliability of the wiring substrate 1Y decreases.

Thus, a measure against ion migration is not sufficient in the wiring substrate 1X or 1Y.

In contrast, according to the wiring substrate 1 of the above-describe embodiment, the width W2 of the metal film 21 is smaller than the width W1 of the upper end face 10a-1 of the projection 10x, and the width W3 of the metal layer 24 is greater than the width W1 of the upper end face 10a-1 of the projection 10x and the width W2 of the metal film 21. This makes it possible for the metal layer 25 for the prevention of ion migration to extend around onto and cover the lower surface 24b of the metal layer 24 famed of a metal that is likely to cause ion migration. Furthermore, the metal layer 25 is also formed on the peripheral portion of the upper end face 10a-1 of the projection 10x. Therefore, the interface between the insulating layer 10 and the insulating layer 30 is covered with the metal layer 25 at the edge of the upper end face 10a-1 of the projection 10x.

Accordingly, it is possible to prevent the occurrence of ion migration at the interface between the insulating layer 10 and the insulating layer 30, that is, it is possible to prevent the deposition of dendrites or metal copper, thus making it possible to achieve the wiring substrate 1 in which a decrease in insulation reliability is prevented. The arrangement discussed in the above-described embodiment is particularly effective in the case of increasing the wiring density of the wiring layer 20 (in the case of forming the wiring layer 20 whose line/space is 10 μm/10 μm or less).

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

Various aspects of the subject-matter described herein may be set out non-exhaustively in the following numbered clauses:

1. A method of manufacturing a wiring substrate, including:
   forming a first metal layer on an insulating layer, the first metal layer including a first surface and a second surface opposite to the first surface of the first metal layer and in contact with a surface of the insulating layer;
   selectively forming a second metal layer on the first metal layer, the second metal layer including a first surface, a second surface opposite to the first surface of the second metal layer and in contact with the first surface of the first metal layer, and side surfaces extending between the first surface of the second metal layer and the second surface of the second metal layer;
   removing the first metal layer exposed through the second metal layer and digging into the surface of the insulating layer exposed by removing the first metal layer to form a projection in the insulating layer and a laminate of the first metal layer and the second metal layer on the projection;
   removing a peripheral portion of the first metal layer to make a width of the first metal layer smaller than a width of the second metal layer to expose a peripheral portion of the second surface of the second metal layer outside the first metal layer;
   removing the insulating layer on a bottom surface side and an inner wall surface side of a depression formed around the projection to deepen the depression and cause the projection to have a width greater than the width of the first metal layer and smaller than the width of the second metal layer;
   forming a third metal layer covering side surfaces of the first metal layer extending between the first surface of the first metal layer and the second surface of the first metal layer, the peripheral portion of the second surface of the second metal layer, the first surface of the second metal layer, and the side surfaces of the second metal layer, and filling in a region where an end face of the projection on which the first metal layer is formed and the peripheral portion of the second surface of the second metal layer face each other.

2. The method of clause 1, wherein the second metal layer is formed of copper, and the third metal layer is formed of nickel phosphorus.

3. The method of clause 1, wherein
   the insulating layer is removed on the bottom surface side and the inner wall surface side of the depression by isotropic etching, and
   the isotropic etching roughens a bottom surface and inner wall surfaces of the depression.

4. The method of clause 1, wherein the first metal layer is removed and the surface of the insulating layer is dug into by a series of processes of anisotropic etching to form the projection.

5. The method of clause 1, further including:
   forming another insulating layer on the insulating layer,
   wherein the other insulating layer covers a wiring layer including the first metal layer, the second metal layer, and the third metal layer, and fills in the depression.

What is claimed is:
1. A wiring substrate comprising:
   an insulating layer including a projection; and
   a wiring layer on the projection;
   the wiring layer including
      a first metal layer on an end face of the projection with a peripheral portion of the end face being exposed around the first metal layer, the first metal layer including a first surface, a second surface opposite to the first surface and in contact with the end face, and side surfaces extending between the first surface of the first metal layer and the second surface of the first metal layer;
      a second metal layer on the first metal layer, the second metal layer including a first surface, a second surface opposite to the first surface of the second metal layer and in contact with the first surface of the first metal layer, and side surfaces extending between the first surface of the second metal layer and the second surface of the second metal layer, the second surface of the second metal layer being on the first metal layer with a peripheral portion of the second surface of the second metal layer being exposed outside the first metal layer, the second metal layer having a width greater than a width of the end face of the projection; and a third metal layer covering the side surfaces of the first metal layer, the first surface of the second metal layer, the peripheral portion of the second surface of the second metal layer, and the side surfaces of the second metal layer, the third metal layer filling in a region where the end face of the projection and the peripheral portion of the second surface of the second metal layer face each other, wherein a material of the second metal layer is different from a material of the third metal layer.

2. The wiring substrate as claimed in claim 1, wherein the second metal layer is formed of copper, and the third metal layer is formed of nickel phosphorus.

3. The wiring substrate as claimed in claim 1, wherein the first metal layer is formed of a metal more adhesive to the insulating layer than is the second metal layer.

4. The wiring substrate as claimed in claim 1, further comprising:

another insulating layer covering the wiring layer and filling in a depression in a region of the insulating layer other than the projection.

\* \* \* \* \*